United States Patent
Chun et al.

(10) Patent No.: US 11,432,070 B2
(45) Date of Patent: Aug. 30, 2022

(54) ELECTRONIC DEVICE, METHOD, AND SYSTEM FOR CONVERTING DIGITAL AUDIO SIGNAL RECEIVED IN WIRED OR WIRELESS MANNER INTO ANALOG AUDIO SIGNAL

(71) Applicant: Samsung Electronics Co., Ltd., Gyeonggi-do (KR)

(72) Inventors: Youngsoo Chun, Gyeonggi-do (KR); Jungsik Park, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/734,625

(22) PCT Filed: Jun. 21, 2019

(86) PCT No.: PCT/KR2019/007514
§ 371 (c)(1),
(2) Date: Dec. 3, 2020

(87) PCT Pub. No.: WO2019/245328
PCT Pub. Date: Dec. 26, 2019

(65) Prior Publication Data
US 2021/0160618 A1 May 27, 2021

(30) Foreign Application Priority Data
Jun. 22, 2018 (KR) .................. 10-2018-0072360

(51) Int. Cl.
*H04R 5/04* (2006.01)
*H04R 1/10* (2006.01)
*H04R 5/033* (2006.01)

(52) U.S. Cl.
CPC ............. *H04R 5/04* (2013.01); *H04R 1/1025* (2013.01); *H04R 5/033* (2013.01); *H04R 2420/07* (2013.01); *H04R 2420/09* (2013.01)

(58) Field of Classification Search
CPC ........ H04R 5/04; H04R 1/1025; H04R 5/033; H04R 2420/07; H04R 2420/09; H04R 1/1041
(Continued)

(56) References Cited

U.S. PATENT DOCUMENTS 10,142,728 B2 11/2018 McCormack et al.
10,595,124 B2 3/2020 McCormack et al.
(Continued)

FOREIGN PATENT DOCUMENTS

JP 4569842 B2 10/2017
KR 1999-0039135 A 6/1999
(Continued)

*Primary Examiner* — Vivian C Chin
*Assistant Examiner* — Con P Tran
(74) *Attorney, Agent, or Firm* — Cha & Reiter, LLC

(57) ABSTRACT

According to an embodiment of the disclosure, disclosed is an electronic device that includes a first connector electrically connectable to an external electronic device, a second connector electrically connectable to an external audio plug, a wireless communication circuit, and at least one processor. When the electronic device is connected to the external electronic device through the first connector, the at least one processor may receive a first digital audio signal from the external electronic device through the first connector, convert the received first digital audio signal into a first analog audio signal, and output the converted first analog audio signal through the second connector. When the electronic device is connected to the external electronic device through the wireless communication circuit, the at least one processor may receive a second digital audio signal from the external electronic device through the wireless communica-
(Continued)

tion circuit, convert the received second digital audio signal into a second analog audio signal having a sound quality lower than that of the first analog audio signal, and output the converted second analog audio signal through the second connector.

6 Claims, 9 Drawing Sheets

(58) Field of Classification Search
USPC ...... 381/74, 58, 56, 394, 384; 439/668, 326; 455/41.2; 341/144; 320/114, 128
See application file for complete search history.

(56) References Cited

U.S. PATENT DOCUMENTS

| | | | | |
|---|---|---|---|---|
| 10,884,444 | B2* | 1/2021 | Bouchez | H02J 3/46 |
| 2004/0122542 | A1* | 6/2004 | Yang | H04M 1/6066 |
| | | | | 700/94 |
| 2005/0027910 | A1 | 2/2005 | Barrett, Jr. et al. | |
| 2009/0124289 | A1 | 5/2009 | Nishida | |
| 2010/0093275 | A1 | 4/2010 | Yoshino et al. | |
| 2013/0331035 | A1* | 12/2013 | Wu | H04B 7/24 |
| | | | | 455/41.2 |
| 2014/0055928 | A1* | 2/2014 | Lee | G06F 1/1632 |
| | | | | 361/679.01 |
| 2014/0169601 | A1* | 6/2014 | Pedersen | H04R 25/552 |
| | | | | 381/316 |
| 2016/0100249 | A1 | 4/2016 | McCormack et al. | |
| 2018/0048803 | A1* | 2/2018 | Morita | H04N 5/23206 |
| 2018/0173661 | A1* | 6/2018 | Rand | G06F 13/4282 |
| 2018/0249277 | A1* | 8/2018 | Voss | H04S 5/00 |
| 2019/0163435 | A1* | 5/2019 | Lambert | G06F 3/162 |
| 2019/0207402 | A1* | 7/2019 | Renken | H04R 25/602 |
| 2021/0263999 | A1* | 8/2021 | Yoshino | G06F 3/162 |

FOREIGN PATENT DOCUMENTS

| | | |
|---|---|---|
| KR | 10-1421161 B1 | 7/2014 |
| KR | 10-1556940 B1 | 10/2015 |
| KR | 10-1575956 B1 | 12/2015 |

* cited by examiner

ELECTRONIC DEVICE, METHOD, AND SYSTEM FOR CONVERTING DIGITAL AUDIO SIGNAL RECEIVED IN WIRED OR WIRELESS MANNER INTO ANALOG AUDIO SIGNAL

CROSS REFERENCE TO RELATED APPLICATIONS

This application is a National Phase Entry of PCT International Application No. PCT/KR2019/007514, which was filed on Jun. 21, 2019, and claims a priority to Korean Patent Application No. 10-2018-0072360, which was filed on Jun. 22, 2018, the contents of which are incorporated herein by reference.

TECHNICAL FIELD

Embodiments of the disclosure relate to a technology for converting a digital audio signal into an analog audio signal.

BACKGROUND ART

With regard to miniaturization or internal structural improvement of a user terminal (e.g., a smart phone), a conventional earphone jack of 3.5 mm diameter provided on the user terminal is being replaced with a USB port. Accordingly, to connect an earphone including an audio plug of 3.5 mm diameter to the user terminal, an adapter supporting connection between the user terminal and the earphone is required.

DISCLOSURE

Technical Problem

When connecting between a user terminal including a USB port and an earphone including an audio plug of 3.5 mm diameter, there may be annoyance of having to always have an adapter for compatibility. Also, to use the earphone without the adapter, the earphone including a digital to analog converter (DAC) for converting a digital audio signal provided from the user terminal into an analog audio signal may be required.

Various embodiments of the disclosure may provide an electronic device, a method, and a system capable of converting the digital audio signal received from the user terminal by wire or wireless into the analog audio signal and providing the converted analog audio signal to an audio output device.

Technical Solution

An electronic device according to an embodiment of the disclosure includes a first connector electrically connectable to an external electronic device, a second connector electrically connectable to an external audio plug, a wireless communication circuit, and at least one processor, and the at least one processor receives, when the electronic device is connected to the external electronic device through the first connector, a first digital audio signal from the external electronic device through the first connector, converts the received first digital audio signal into a first analog audio signal, and outputs the converted first analog audio signal through the second connector, and when the electronic device is connected to the external electronic device through the wireless communication circuit, receives a second digital audio signal from the external electronic device through the wireless communication circuit, converts the received second digital audio signal into a second analog audio signal having a sound quality lower than that of the first analog audio signal, and outputs the converted second analog audio signal through the second connector.

In addition, a method of outputting an audio signal by an electronic device according to an embodiment of the disclosure includes, when the electronic device is connected to an external electronic device through a first connector of the electronic device, receiving a first digital audio signal from the external electronic device through the first connector, converting the received first digital audio signal into a first analog audio signal, and outputting the converted first analog audio signal through a second connector of the electronic device, and when the electronic device is connected to the external electronic device through a wireless communication, receiving a second digital audio signal from the external electronic device through the wireless communication, converting the received second digital audio signal into a second analog audio signal having a sound quality lower than that of the first analog audio signal, and outputting the converted second analog audio signal through the second connector.

In addition, a system including an external electronic device, an electronic device connected to the external electronic device, and an audio output device connected to the electronic device, according to an embodiment of the disclosure includes, when the external electronic device and the electronic device are connected through a wired communication, that the external electronic device transmits a first digital audio signal to the electronic device through the wired communication, the electronic device converts the first digital audio signal into a first analog audio signal, and the electronic device outputs the converted first analog audio signal to the audio output device, and when the external electronic device and the electronic device are connected through a wireless communication, that the external electronic device transmits a second digital audio signal to the electronic device through the wireless communication, the electronic device converts the second digital audio signal into a second analog audio signal having a sound quality lower than that of the first analog audio signal, and the electronic device outputs the converted second analog audio signal to the audio output device.

Advantageous Effects

According to various embodiments of the disclosure, as an electronic device converts a digital audio signal received from a user terminal by wire or wireless into an analog audio signal and provides the analog audio signal to an audio output device, convenience of use of the audio output device may be improved.

In addition, according to various embodiments of the disclosure, when the electronic device and the user terminal are connected by wire, a battery of the electronic device is charged and a wireless communication circuit is turned off, thus efficient power management of the electronic device may be achieved.

In addition to this, various effects may be provided that are directly or indirectly identified through this document.

DESCRIPTION OF DRAWINGS

In connection with the description of the drawings, the same or similar reference numerals may be used for the same or similar components.

MODE FOR INVENTION

Hereinafter, various embodiments of the present disclosure may be described with reference to accompanying drawings. Accordingly, those of ordinary skill in the art will recognize that modification, equivalent, and/or alternative on the various embodiments described herein can be variously made without departing from the scope and spirit of the present disclosure.

Figure 1A:
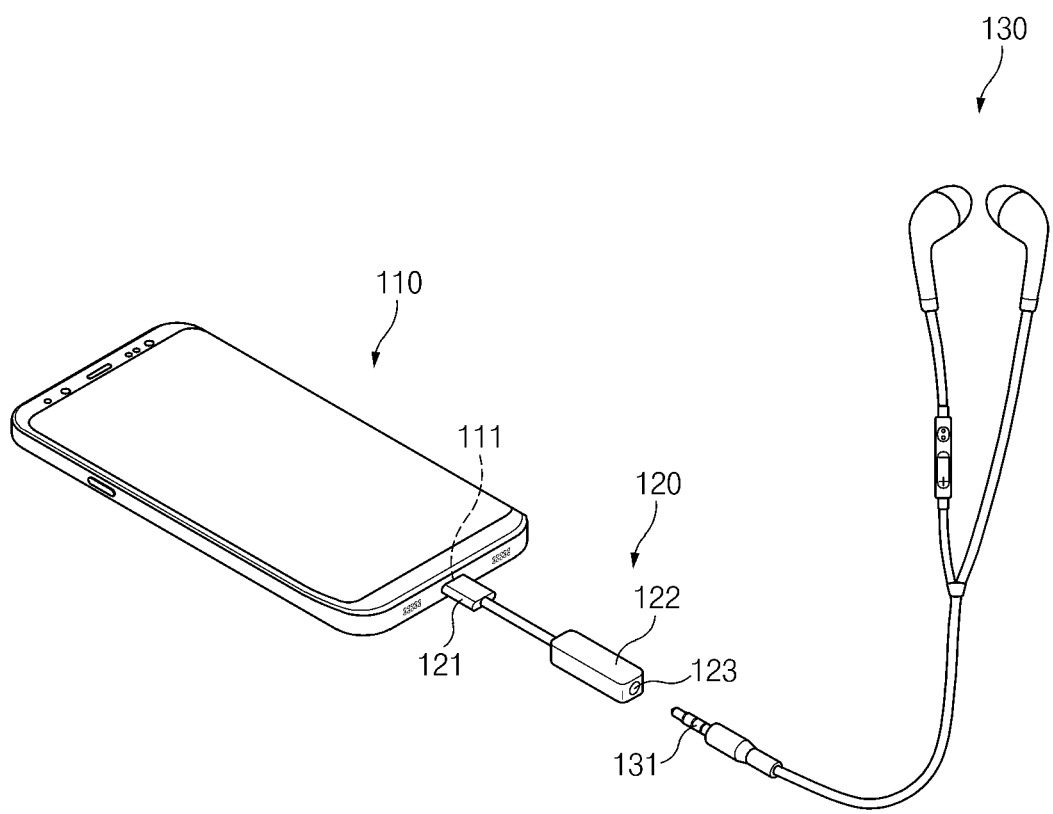
FIG. 1A is a diagram illustrating an operating environment when an electronic device according to an embodiment is connected to an external electronic device through a wired communication.
Figure 1B:
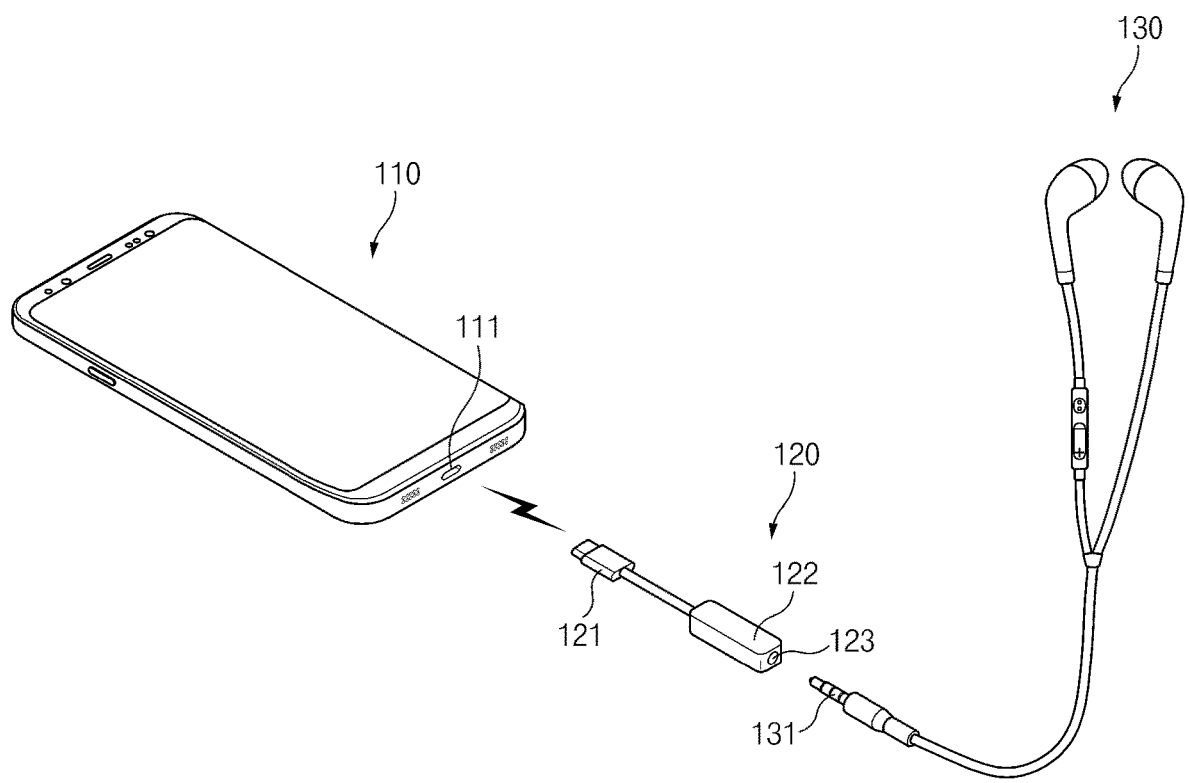
FIG. 1B is a diagram illustrating an operating environment when an electronic device according to an embodiment is connected to an external electronic device through a wireless communication.

FIG. 1A is a diagram illustrating an operating environment when an electronic device according to an embodiment is connected to an external electronic device through a wired communication. FIG. 1B is a diagram illustrating an operating environment when an electronic device according to an embodiment is connected to an external electronic device through a wireless communication.

Referring to FIG. 1A, an electronic device 120 may be wiredly connected to a port 111 of an external electronic device 110 through a first connector 121. According to an embodiment, the electronic device 120 may receive a digital audio signal from the external electronic device 110 through a wired communication according to the wired connection. An integrated circuit disposed inside a housing 122 of the electronic device 120 may convert the received digital audio signal into an analog audio signal. In an embodiment, an audio output device 130 may be connected to a second connector 123 of the electronic device 120 through an audio plug 131. The electronic device 120 may output the converted analog audio signal to the audio output device 130 through the second connector 123. The audio output device 130 may output sound by processing the analog audio signal provided from the electronic device 120.

Referring to FIG. 1B, the electronic device 120 may be wirelessly connected to the external electronic device 110 through the wireless communication circuit disposed inside the housing 122. According to an embodiment, the electronic device 120 may receive the digital audio signal from the external electronic device 110 through the wireless communication according to the wireless connection. An integrated circuit disposed inside the housing 122 of the electronic device 120 may convert the received digital audio signal into an analog audio signal. In an embodiment, the audio output device 130 may be connected to the second connector 123 of the electronic device 120 through the audio plug 131. The electronic device 120 may output the converted analog audio signal to the audio output device 130 through the second connector 123. The audio output device 130 may output sound by processing the analog audio signal provided from the electronic device 120.

Figure 2:
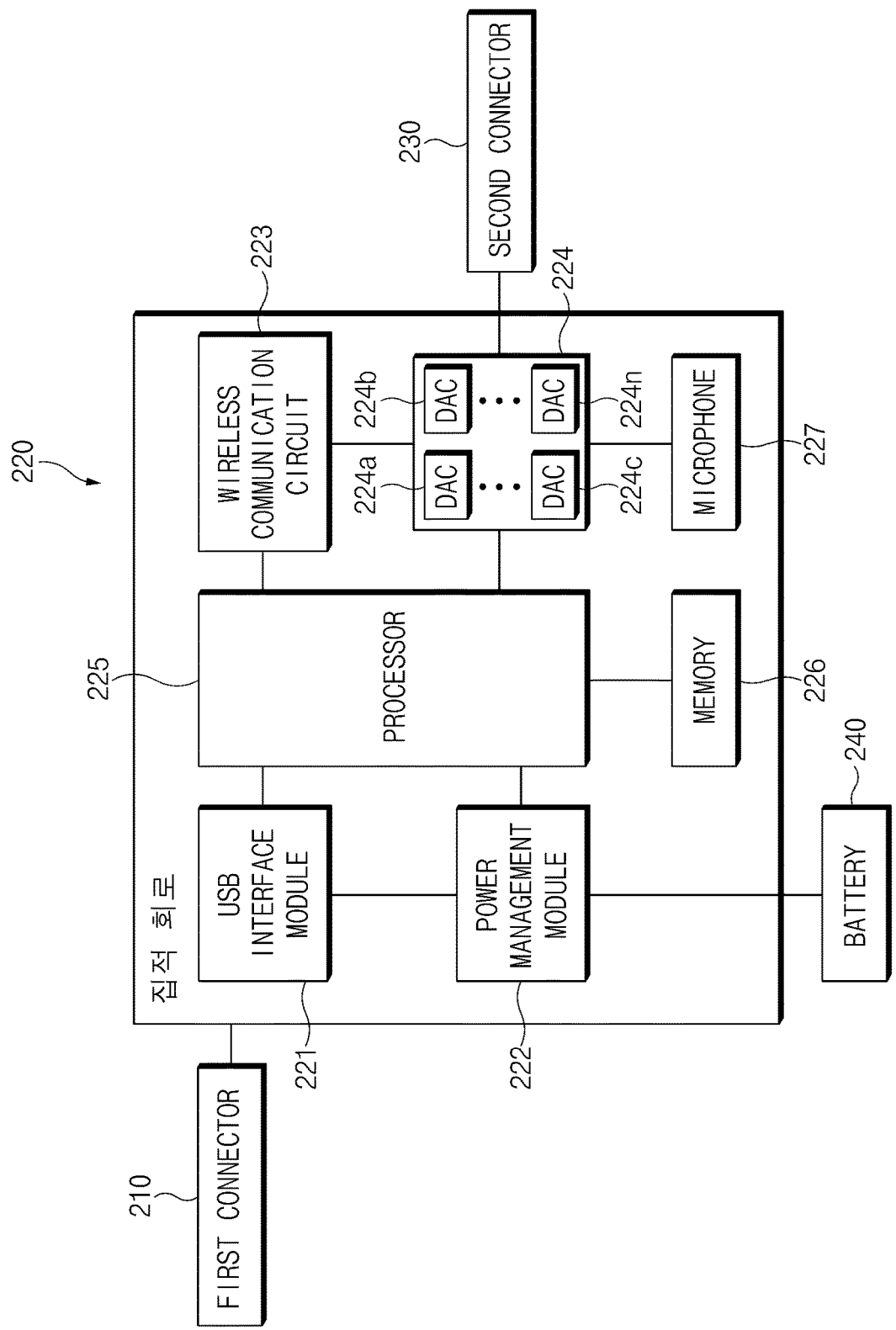
FIG. 2 is a block diagram of an electronic device according to an embodiment.

FIG. 2 is a block diagram of an electronic device according to an embodiment.

Referring to FIG. 2, an electronic device (e.g., 120 in FIG. 1A or FIG. 1B) may include a first connector 210, an integrated circuit 220, a second connector 230, a battery 240, and the like. According to an embodiment, the electronic device may further include a component not shown in FIG. 2. For example, the electronic device may further include components of the electronic device (e.g., 701 of FIG. 7) to be referred to through FIG. 7 to be described later.

The first connector 210 may support a connection between an electronic device and an external electronic device (e.g., 110 in FIG. 1A or FIG. 1B). According to an embodiment, the electronic device may perform a USB communication with an external electronic device through the first connector 210. According to an embodiment, the first connector 210 may include a micro USB type connector, a USB-C type connector, or a lightning connector.

The integrated circuit 220 may include a USB interface module 221, a power management module 222, a wireless communication circuit 223, a DAC 224, a processor 225, a memory 226, and a microphone 227.

The USB interface module 221 may convert a signal (e.g., a PCM signal) according to a USB protocol received from an external electronic device through the first connector 210 into the digital audio signal. According to an embodiment, the USB interface module 221 may transfer power supplied from an external electronic device through the first connector 210 to the power management module 222.

The power management module 222 may manage power of the battery 240. For example, the power management module 222 may charge the battery 240 using power received through the USB interface module 221. According to an embodiment, the power management module 222 may turn on or off a charging function for the battery 240. For example, the power management module 222 may measure a voltage of the battery 240 and may turn on or off the charging function, based on the measured current voltage of the battery 240. According to various embodiments, the power management module 222 may charge the battery of the external electronic device connected through the first connector 210 by using the power of the battery 240.

The wireless communication circuit 223 may support the wireless communication between the electronic device and the external electronic device. In an embodiment, the wireless communication circuit 223 may support at least one of WiFi communication and Bluetooth communication. The wireless communication circuit 223 may decode a wireless signal received from the external electronic device and may convert the decoded wireless signal into the digital audio signal.

According to one embodiment, the wireless communication circuit 223 may support the wireless communication between the electronic device and the external audio output device. According to an embodiment, the external audio output device may be an audio output device (e.g., a Bluetooth earphone) including a wireless communication function. In this case, the electronic device may transmit an audio signal to the external audio output device through the wireless communication circuit 223.

The DAC (digital-to-analog converter) 224 may convert the digital audio signal into the analog audio signal. For example, the DAC 224 may convert the digital audio signal of a preset format into the analog audio signal, based on a set sampling rate. In various embodiments, the DAC 224 may change the sampling rate under a control of the processor 225 and may change a mute, an equalizer, or a pitch of a sound. The analog audio signal converted by the DAC 224 may be output to an outside through the second connector 230 or may be transmitted to the outside through the wireless communication circuit 223.

According to an embodiment, the electronic device may include a plurality of DACs 224a to 224n. In one embodiment, when the processor 225 converts the digital audio signal into the analog audio signal using the plurality of DACs 224a to 224n, it is possible to generate an analog audio signal of higher sound quality than when converting the signal using a single DAC.

The processor 225 may be electrically connected to the USB interface module 221, the power management module 222, the wireless communication circuit 223, the DAC 224, the memory 226, and the microphone 227, and may control the overall operation of the components. The processor 225 may include, for example, a micro controller unit (MCU).

The memory 226 may store commands, information, or data related to operations of the components 221 to 225 and 227 included in the integrated circuit 220. For example, the memory 226 may store instructions that, when executed, enable the processor 225 to control various operations of the components 221 to 225 and 227.

The microphone 227 may convert external sound into an electric voice signal. The voice signal acquired through the microphone 227 may be transferred to the external electronic device connected through the first connector 210.

The second connector 230 may support the connection between the electronic device and the external audio output device. For example, the second connector 230 may be connected to an audio plug (e.g., 131 of FIG. 1A or FIG. 1B) included in the external audio output device. In an embodiment, the analog audio signal converted by the DAC 224 may be output to the external audio output device through the second connector 230.

According to an embodiment, the second connector 230 may be connected to the audio plug included in the external audio input device or the external audio input/output device. The external audio input device or the external audio input/output device may include, for example, a microphone. In an embodiment, when the external audio input device or the external audio input/output device is connected to the second connector 230, the processor 225 may control deactivation of the microphone 227 and may transfer the audio input signal received from the external audio input device or the external audio input/output device to the external electronic device.

In connection with the description of FIGS. 3 to 5 below, operations described as being performed by the electronic device may be understood as being performed by the processor 225 of the electronic device. For example, the processor 225 may execute at least one instruction (or instruction) stored in the memory 226 of the electronic device to perform the operations, or may allow components of the electronic device to perform the above operations by executing the at least one instruction.

Figure 3:
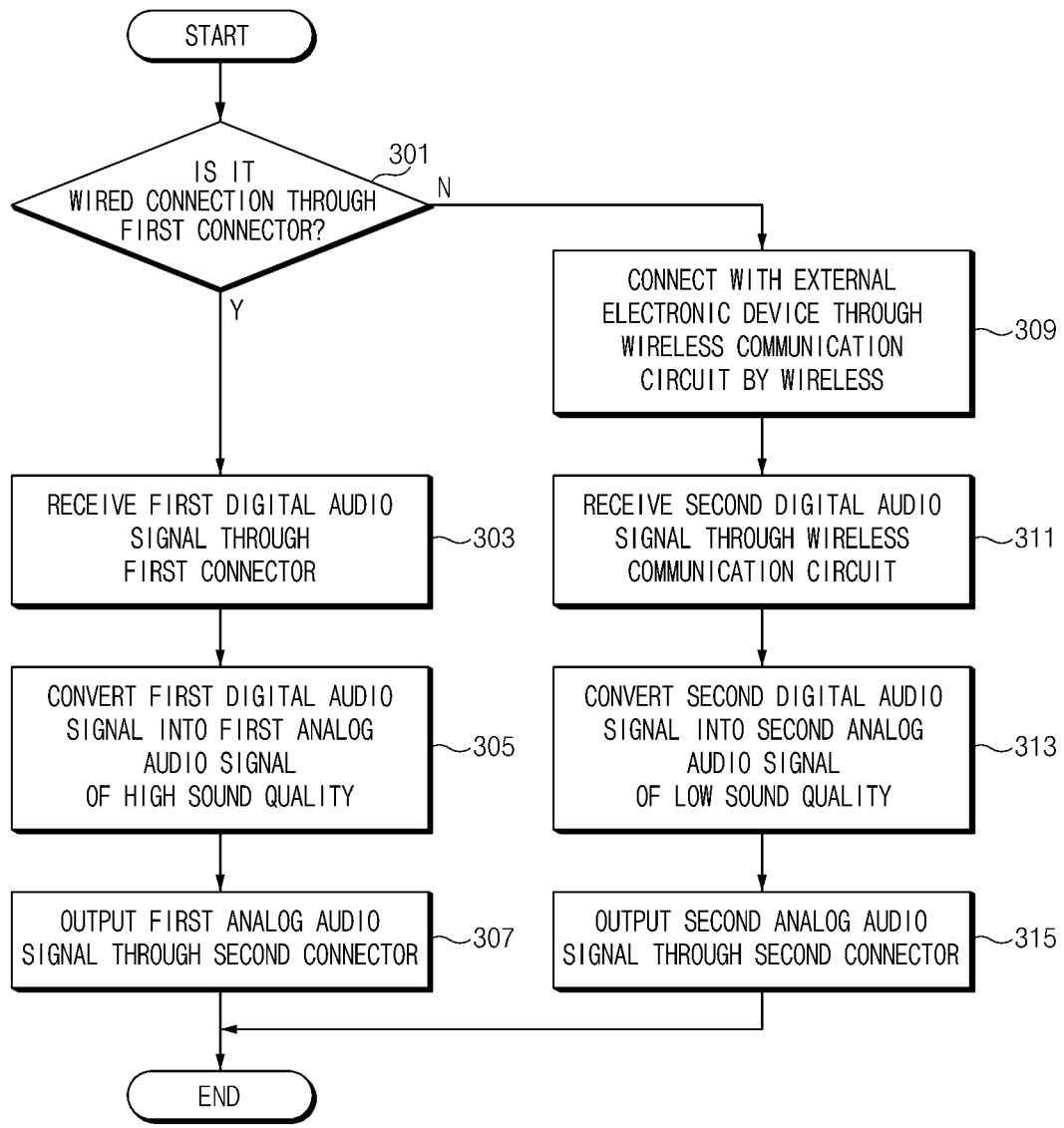
FIG. 3 is a flowchart illustrating a method of outputting an audio signal by an electronic device according to an embodiment.

FIG. 3 is a flowchart illustrating a method of outputting an audio signal by an electronic device according to an embodiment.

Referring to FIG. 3, in operation 301, the processor (e.g., 225 in FIG. 2) may determine whether an electronic device (e.g., 120 in FIG. 1A or 1B) is wiredly connected to an external electronic device (e.g., 110 in FIG. 1A or FIG. 1B) through a first connector (e.g., 210 in FIG. 2).

According to an embodiment, as the first connector 210 is inserted (or connected) to a port of the external electronic device 110, the electronic device 120 and the external electronic device 110 may be connected by wire.

In one embodiment, when it is determined that the electronic device 120 is wiredly connected to the external electronic device 110 through the first connector 210, in operation 303, the processor 225 may receive the PCM signal from the external electronic device 110 through the first connector 210. In this regard, a USB interface module (e.g., 221 of FIG. 2) may convert the PCM signal received through the first connector 210 into a first digital audio signal.

In operation 305, the processor 225 may convert the first digital audio signal into a first analog audio signal of high sound quality.

According to an embodiment, the first analog audio signal of high sound quality may include an audio signal of 24 bit 384 khz. The first analog audio signal of high sound quality may have a greater dynamic range than the second analog signal of low sound quality mentioned in operation 313 below.

According to one embodiment, the processor 225 may convert the first digital audio signal into the first analog audio signal of high sound quality by using a plurality of DACs (e.g., 224 in FIG. 2).

According to one embodiment, the processor 225 may convert the first digital audio signal into the first analog audio signal in a high power mode. In other words, when the electronic device 120 is connected to the external electronic device 110 through the first connector 210, the processor 225 may convert the first digital audio signal into the first analog audio signal in the high power mode. According to various embodiments, the high power mode may be a mode that converts the audio signal using all of the plurality of DACs 224.

In operation 307, the processor 225 may output the first analog audio signal through a second connector (e.g., 230 of FIG. 2).

According to an embodiment, an external audio plug (e.g., 131 of FIG. 1A or FIG. 1B) of an audio output device (e.g., 130 of FIG. 1A or FIG. 1B) may be connected to the second connector 230. The audio output device 130 may output a related sound by processing the first analog audio signal received through the external audio plug 131.

In an embodiment, when it is determined that the electronic device 120 is not wiredly connected to the external electronic device 110 through the first connector 210, in operation 309, the processor 225 may wirelessly connect between the electronic device 120 and the external electronic device 110 through a wireless communication circuit (e.g., 223 in FIG. 2).

According to an embodiment, the processor 225 may perform a Bluetooth connection or a WiFi connection with the external electronic device 110, and may wirelessly connect the electronic device 120 and the external electronic device 110. For example, the processor 225 may perform the wireless connection through an AP by using a WiFi direct technology or by connecting the same access point (AP) as the external electronic device 110.

According to one embodiment, in a state in which the electronic device 120 is connected to the external electronic device 110 through the first connector 210, when the connection with the external electronic device 110 connected through the first connector 210 is released, the processor 225 may wirelessly connect to the external electronic device 110 through the wireless communication circuit 223.

According to an embodiment, in a state in which the electronic device 120 is connected to the external electronic device 110 through the wireless communication circuit 223, when the electronic device 120 is connected to the external electronic device 110 through the first connector 210, the processor 225 may release the connection with the external electronic device 110 connected through the wireless communication circuit 223.

In operation 311, the processor 225 may receive a wireless signal from the external electronic device 110 through the wireless communication circuit 223.

According to an embodiment, the wireless communication circuit 223 may receive the wireless signal from the external electronic device 110, may decode the received wireless signal, and may convert the decoded wireless signal into a second digital audio signal.

In operation 313, the processor 225 may convert the second digital audio signal into a second analog audio signal of low sound quality.

According to an embodiment, the second analog audio signal of low sound quality may include an audio signal of 16 bit 48 khz. The second analog audio signal of low sound quality may have a smaller dynamic range than the first analog signal of high sound quality mentioned in operation 305, for example.

According to an embodiment, the processor 225 may convert the second digital audio signal into the second analog audio signal having a sound quality lower than that of the first analog audio signal using some of the plurality of DACs 224.

According to an embodiment, the processor 225 may convert the second digital audio signal into the second analog audio signal in a low power mode. In other words, when the electronic device 120 is connected to the external electronic device 110 through the wireless communication circuit 223, the processor 225 may convert the second digital audio signal into the second analog audio signal in the low power mode. According to various embodiments, the low power mode may be a mode in which the audio signal is converted using some of the DACs 224.

In operation 315, the processor 225 may output the second analog audio signal through the second connector 230.

Figure 4:
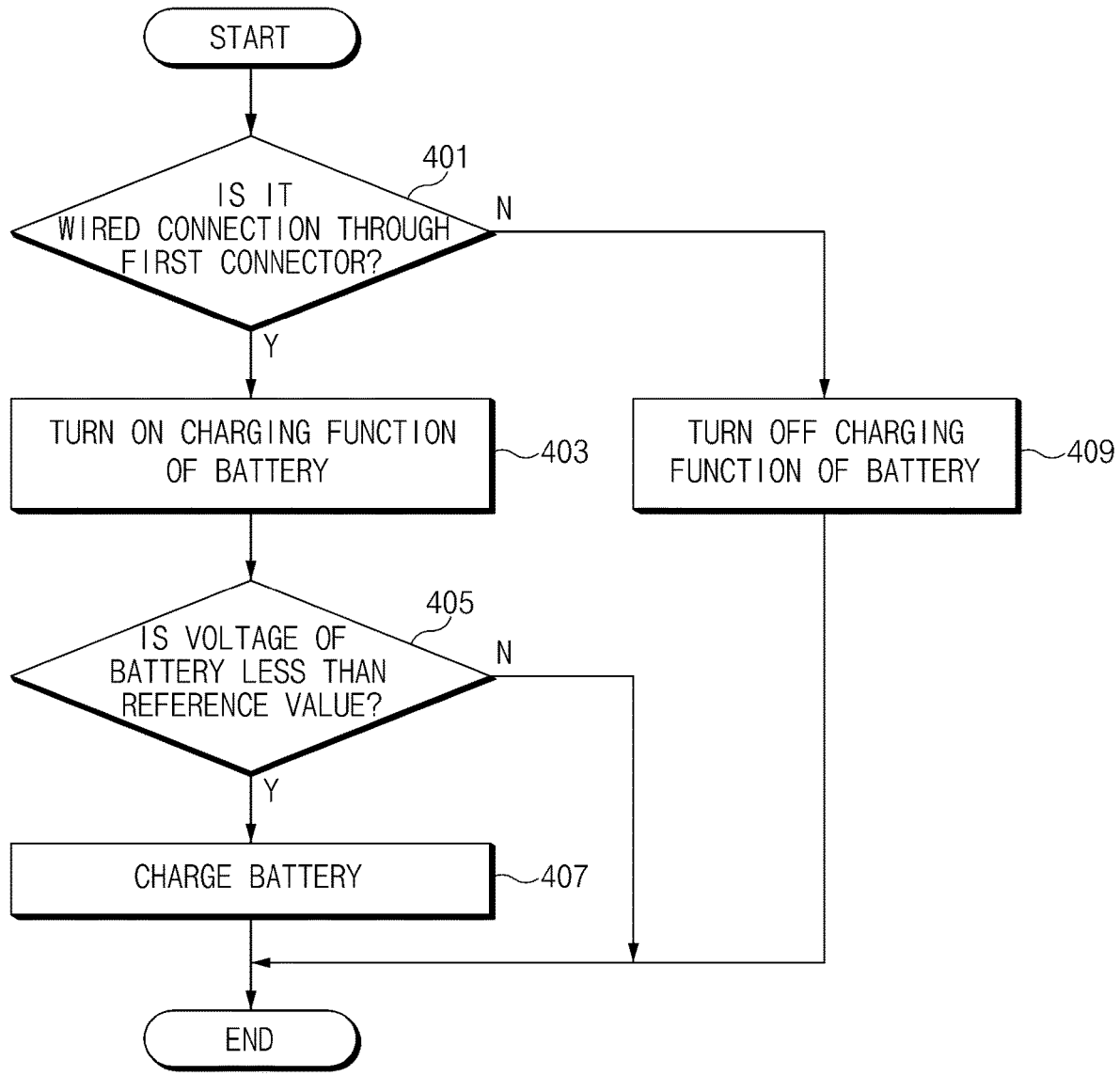
FIG. 4 is a flowchart illustrating a method of charging a battery depending on whether an electronic device is connected through a first connector, according to an embodiment.

FIG. 4 is a flowchart illustrating a method of charging a battery depending on whether an electronic device is connected through a first connector, according to an embodiment.

Referring to FIG. 4, in operation 401, a processor (e.g., 225 in FIG. 2) may determine whether an electronic device (e.g., 120 in FIG. 1A or FIG. 1B) is wiredly connected to an external electronic device (e.g., 110 in FIG. 1A or FIG. 1B) through a first connector (e.g., 210 in FIG. 2).

In an embodiment, when it is determined that the electronic device 120 is wiredly connected to the external electronic device 110 through the first connector 210, in operation 403, the processor 225 may turn on the charging function for a battery (e.g., 240 in FIG. 2).

In operation 405, the processor 225 may determine whether the voltage of the battery 240 is less than a specified reference value.

In an embodiment, when the voltage of the battery 240 is less than the specified reference value, in operation 407, the processor 225 may charge the battery 240. For example, the processor 225 may charge the battery 240 using power received from the external electronic device 110 connected through the first connector 210.

In an embodiment, when the voltage of the battery 240 is equal to or greater than the specified reference value, the processor 225 may not charge the battery 240.

In an embodiment, when it is determined that the electronic device 120 is not wiredly connected to the external electronic device 110 through the first connector 210, in operation 409, the processor 225 may turn off the charging function of the battery 240. In other words, the processor 225 may refrain from charging the battery 240.

According to various embodiments, some of the operations described with reference to FIG. 4 may be omitted. For example, the execution of operation 405 may be omitted. In this case, when the electronic device 120 is wiredly connected to the external electronic device 110 through the first connector 210, the processor 225 may charge the battery 240 regardless of whether the voltage of the battery 240 is less than the specified reference value.

Figure 5:
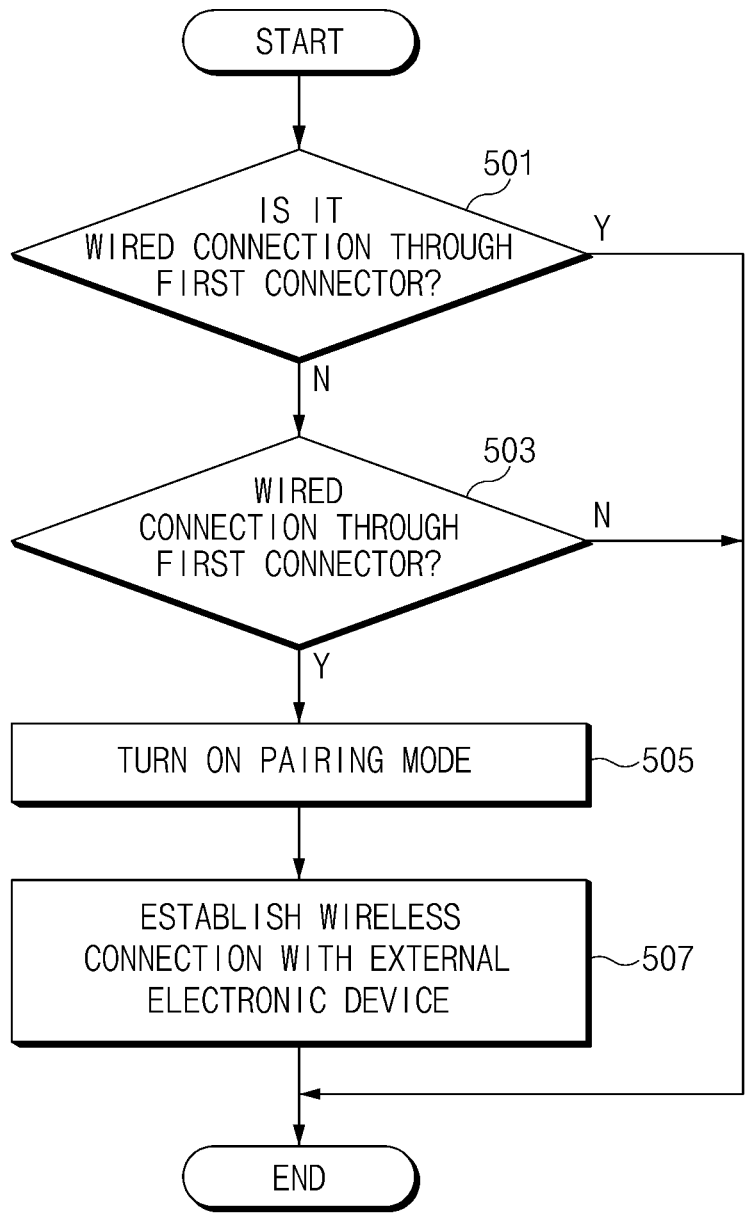
FIG. 5 is a flowchart illustrating a method of turning on a pairing mode by an electronic device according to an embodiment.

FIG. 5 is a flowchart illustrating a method of turning on a pairing mode by an electronic device according to an embodiment.

Referring to FIG. 5, in operation 501, a processor (e.g., 225 in FIG. 2) may determine whether an electronic device (e.g., 120 in FIG. 1A or FIG. 1B) is wiredly connected to an external electronic device (e.g., 110 in FIG. 1A or FIG. 1B) through a first connector (e.g., 210 in FIG. 2).

In an embodiment, when it is determined that the electronic device 120 is not connected to the external electronic device 110 through the first connector 210 by wire, in operation 503, the processor 225 may determine whether an audio plug (e.g., 131 of FIG. 1A or FIG. 1B) is inserted into the second connector 230.

According to an embodiment, the processor 225 may determine whether the audio plug 131 is inserted based on a voltage applied to the second connector (e.g., 230 of FIG. 2).

In an embodiment, when it is recognized (or determined) that the audio plug 131 is inserted into the second connector 230, in operation 505, the processor 225 may turn on the pairing mode of the electronic device 120.

In an embodiment, when the pairing mode is turned on, the electronic device 120 may operate in a standby mode for establishing the wireless connection with the external electronic device 110. The external electronic device 110 may transmit a request (or a request signal) for the wireless connection with the electronic device 120 in a wireless connection standby mode to the electronic device 120.

According to an embodiment, when the processor 225 does not receive a wireless connection request from the external electronic device 110 within a set time, the processor 225 may turn off power of the electronic device 120.

In an embodiment, when the wireless connection request is received from the external electronic device 110 within the set time, in operation 507, the processor 225 may establish the wireless connection with the external electronic device 110. In an embodiment, the processor 225 may respond to the wireless connection request by the external electronic device 110 and may establish the wireless connection with the external electronic device 110 as at least part of the response.

Figure 6A:
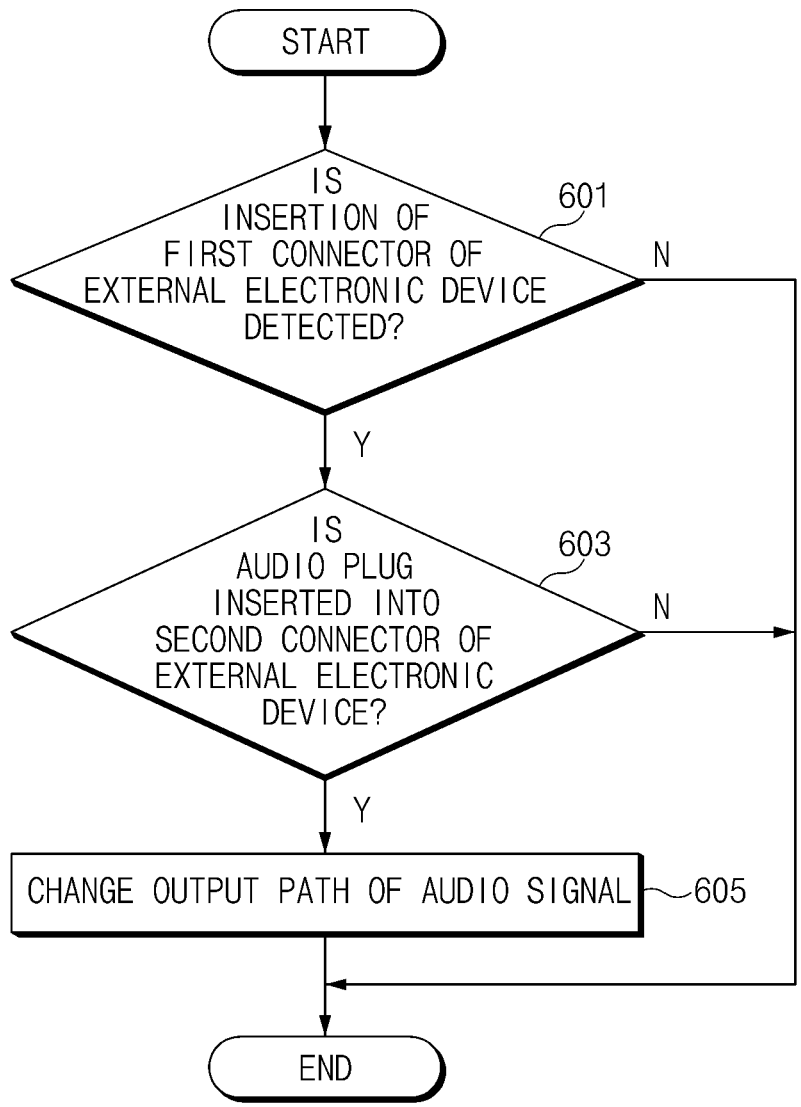
FIG. 6A is a flowchart illustrating a method of changing an audio signal output path by an electronic device according to an embodiment.
Figure 6B:
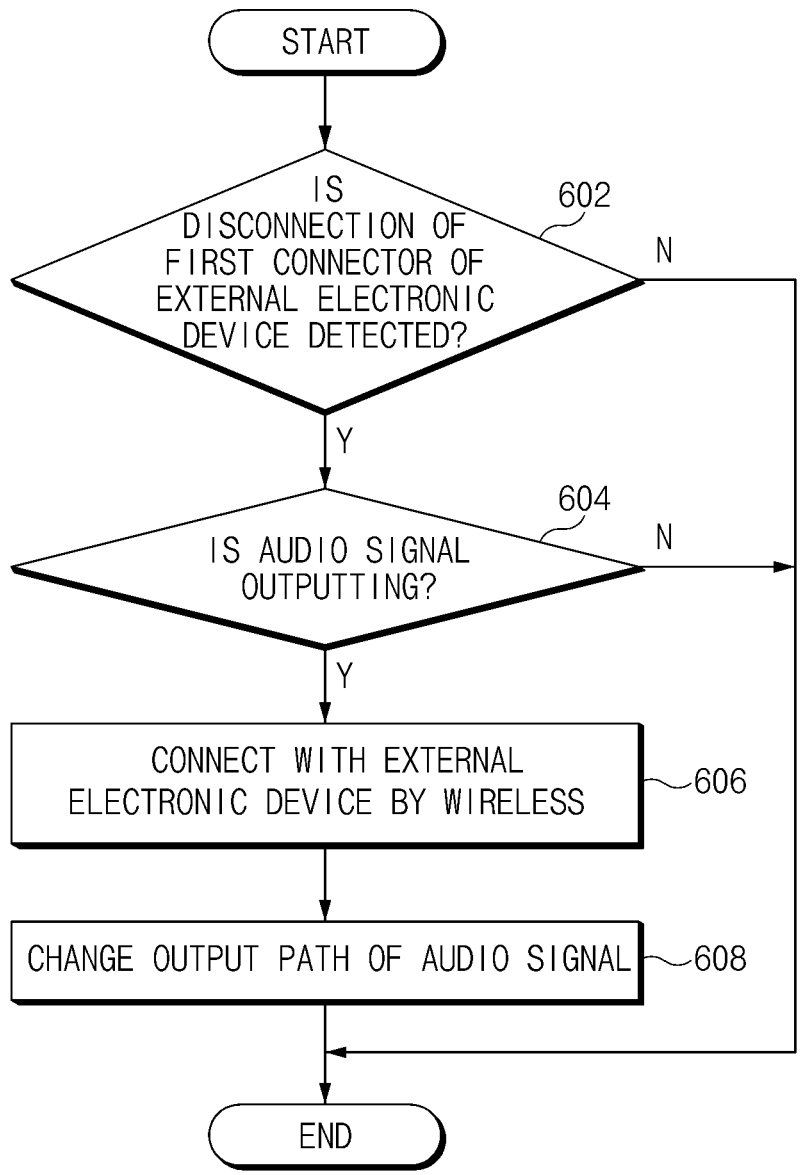
FIG. 6B is a flowchart illustrating a method of changing an audio signal output path by an electronic device according to another embodiment.

FIG. 6A is a flowchart illustrating a method of changing an audio signal output path by an electronic device according to an embodiment. FIG. 6B is a flowchart illustrating a method of changing an audio signal output path by an electronic device according to another embodiment.

The electronic device referred to through FIGS. 6A and 6B may correspond to the external electronic device 110 illustrated in FIG. 1A or FIG. 1B, and the external electronic device may correspond to the electronic device 120 illustrated in FIG. 1A or FIG. 1B.

Before operation 601 is performed, it is assumed that the first connector (e.g., 210 in FIG. 2) of the external electronic device 120 is not connected (or inserted) to the electronic device 110.

Referring to FIG. 6A, in operation 601, the electronic device 110 may detect whether the first connector 210 of the external electronic device 120 is inserted into the electronic device 110.

According to an embodiment, the electronic device 110 may detect whether the first connector 210 of the external electronic device 120 is inserted based on a voltage applied to the port of the electronic device 110.

In an embodiment, when insertion of the first connector 210 is detected, in operation 603, the electronic device 110 may determine whether an audio plug (e.g., 131 in FIG. 1A or FIG. 1B) is inserted into a second connector (e.g., 230 in FIG. 2) of the external electronic device 120.

In an embodiment, when it is determined that the audio plug 131 is inserted into the second connector 230 of the external electronic device 120, in operation 605, the electronic device 110 may change an output path of the audio signal to the external electronic device 120. Accordingly, when the audio signal output path is changed to the external electronic device 120 while the audio signal is output through a speaker of the electronic device 110, the audio signal is not output through the speaker and may be output through an audio output device (e.g., 130 in FIG. 1A or FIG. 1B) connected to the external electronic device 120.

Before operation 602 is performed, it is assumed that the first connector 210 of the external electronic device 120 is connected (or inserted) to the electronic device 110.

Referring to FIG. 6B, in operation 602, the electronic device 110 may detect whether the first connector 210 of the external electronic device 120 is disconnected from the electronic device 110.

According to an embodiment, the electronic device 110 may detect whether the first connector 210 of the external electronic device 120 is disconnected based on a voltage applied to the port of the electronic device 110.

In an embodiment, after the disconnection of the first connector 210 is detected, in operation 604, when the electronic device 110 is outputting the audio signal, in operation 606, the electronic device 110 may wirelessly connect with the external electronic device 120. For example, the electronic device 110 may wirelessly connect with the external electronic device 120 by performing the Bluetooth communication or the WiFi communication.

In operation 608, the electronic device 110 may change the output path of the audio signal to the external electronic device 120. According to this, when the audio signal output path is changed to the external electronic device 120 while the audio signal is outputting through the speaker of the electronic device 110, the audio signal is not output through the speaker and may be transmitted to the external electronic device 120 through the wireless communication. The audio signal wirelessly transmitted to the external electronic device 120 may be output through the audio output device 130 connected to the external electronic device 120.

Figure 7:
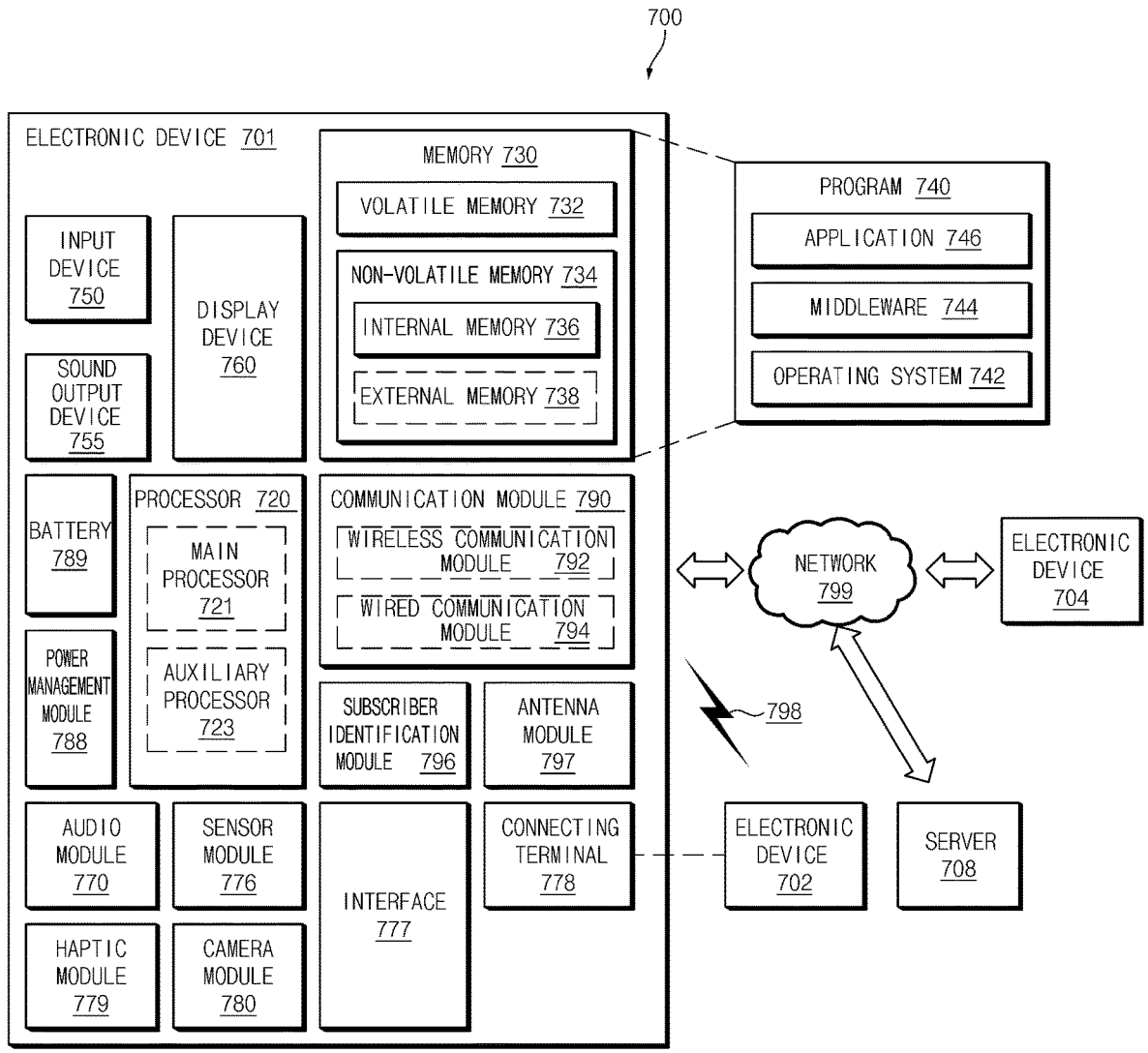
FIG. 7 is a block diagram of an electronic device in a network environment 700 according to various embodiments.

FIG. 7 is a block diagram of an electronic device in a network environment according to various embodiments.

Referring to FIG. 7, an electronic device 701 may communicate with an electronic device 702 through a first network 798 (e.g., a short-range wireless communication) or may communicate with an electronic device 704 or a server 708 through a second network 799 (e.g., a long-distance wireless communication) in a network environment 700. According to an embodiment, the electronic device 701 may communicate with the electronic device 704 through the server 708. According to an embodiment, the electronic device 701 may include a processor 720, a memory 730, an input device 750, a sound output device 755, a display device 760, an audio module 770, a sensor module 776, an interface 777, a haptic module 779, a camera module 780, a power management module 788, a battery 789, a communication module 790, a subscriber identification module 796, and an antenna module 797. According to some embodiments, at least one (e.g., the display device 760 or the camera module 780) among components of the electronic device 701 may be omitted or other components may be added to the electronic device 701. According to some embodiments, some components may be integrated and implemented as in the case of the sensor module 776 (e.g., a fingerprint sensor, an iris sensor, or an illuminance sensor) embedded in the display device 760 (e.g., a display).

The processor 720 may operate, for example, software (e.g., a program 740) to control at least one of other components (e.g., a hardware or software component) of the electronic device 701 connected to the processor 720 and may process and compute a variety of data. The processor 720 may load a command set or data, which is received from other components (e.g., the sensor module 776 or the communication module 790), into a volatile memory 732, may process the loaded command or data, and may store result data into a nonvolatile memory 734. According to an embodiment, the processor 720 may include a main processor 721 (e.g., a central processing unit or an application processor) and an auxiliary processor 723 (e.g., a graphic processing device, an image signal processor, a sensor hub processor, or a communication processor), which operates independently from the main processor 721, additionally or alternatively uses less power than the main processor 721, or is specified to a designated function. In this case, the auxiliary processor 723 may operate separately from the main processor 721 or embedded.

In this case, the auxiliary processor 723 may control, for example, at least some of functions or states associated with at least one component (e.g., the display device 760, the sensor module 776, or the communication module 790) among the components of the electronic device 701 instead of the main processor 721 while the main processor 721 is in an inactive (e.g., sleep) state or together with the main processor 721 while the main processor 721 is in an active (e.g., an application execution) state. According to an embodiment, the auxiliary processor 723 (e.g., the image signal processor or the communication processor) may be implemented as a part of another component (e.g., the camera module 780 or the communication module 790) that is functionally related to the auxiliary processor 723. The memory 730 may store a variety of data used by at least one component (e.g., the processor 720 or the sensor module 776) of the electronic device 701, for example, software (e.g., the program 740) and input data or output data with respect to commands associated with the software. The memory 730 may include the volatile memory 732 or the nonvolatile memory 734.

The program 740 may be stored in the memory 730 as software and may include, for example, an operating system 742, a middleware 744, or an application 746.

The input device 750 may be a device for receiving a command or data, which is used for a component (e.g., the processor 720) of the electronic device 701, from an outside (e.g., a user) of the electronic device 701 and may include, for example, a microphone, a mouse, or a keyboard.

The sound output device 755 may be a device for outputting a sound signal to the outside of the electronic device 701 and may include, for example, a speaker used for general purposes, such as multimedia play or recordings play, and a receiver used only for receiving calls. According to an embodiment, the receiver and the speaker may be either integrally or separately implemented.

The display device 760 may be a device for visually presenting information to the user of the electronic device 701 and may include, for example, a display, a hologram device, or a projector and a control circuit for controlling a corresponding device. According to an embodiment, the display device 760 may include a touch circuitry or a pressure sensor for measuring an intensity of pressure on the touch.

The audio module 770 may convert a sound and an electrical signal in dual directions. According to an embodiment, the audio module 770 may obtain the sound through the input device 750 or may output the sound through an external electronic device (e.g., the electronic device 702 (e.g., a speaker or a headphone)) wired or wirelessly connected to the sound output device 755 or the electronic device 701.

The sensor module 776 may generate an electrical signal or a data value corresponding to an operating state (e.g., power or temperature) inside or an environmental state outside the electronic device 701. The sensor module 776 may include, for example, a gesture sensor, a gyro sensor, a barometric pressure sensor, a magnetic sensor, an acceleration sensor, a grip sensor, a proximity sensor, a color sensor, an infrared sensor, a biometric sensor, a temperature sensor, a humidity sensor, or an illuminance sensor.

The interface 777 may support a designated protocol wired or wirelessly connected to the external electronic device (e.g., the electronic device 702). According to an embodiment, the interface 777 may include, for example, an HDMI (high-definition multimedia interface), a USB (universal serial bus) interface, an SD card interface, or an audio interface.

A connecting terminal 778 may include a connector that physically connects the electronic device 701 to the external electronic device (e.g., the electronic device 702), for example, an HDMI connector, a USB connector, an SD card connector, or an audio connector (e.g., a headphone connector).

The haptic module 779 may convert an electrical signal to a mechanical stimulation (e.g., vibration or movement) or an electrical stimulation perceived by the user through tactile or kinesthetic sensations. The haptic module 779 may include, for example, a motor, a piezoelectric element, or an electric stimulator.

The camera module 780 may shoot a still image or a video image. According to an embodiment, the camera module 780 may include, for example, at least one lens, an image sensor, an image signal processor, or a flash.

The power management module 788 may be a module for managing power supplied to the electronic device 701 and may serve as at least a part of a power management integrated circuit (PMIC).

The battery 789 may be a device for supplying power to at least one component of the electronic device 701 and may include, for example, a non-rechargeable (primary) battery, a rechargeable (secondary) battery, or a fuel cell.

The communication module 790 may establish a wired or wireless communication channel between the electronic device 701 and the external electronic device (e.g., the electronic device 702, the electronic device 704, or the server 708) and support communication execution through the established communication channel. The communication module 790 may include at least one communication processor operating independently from the processor 720 (e.g., the application processor) and supporting the wired communication or the wireless communication. According to an embodiment, the communication module 790 may include a wireless communication module 792 (e.g., a cellular communication module, a short-range wireless communication module, or a GNSS (global navigation satellite system) communication module) or a wired communication module 794 (e.g., an LAN (local area network) communication module or a power line communication module) and may communicate with the external electronic device using a corresponding communication module among them through the first network 798 (e.g., the short-range communication network such as a Bluetooth, a WiFi direct, or an IrDA (infrared data association)) or the second network 799 (e.g., the long-distance wireless communication network such as a cellular network, an internet, or a computer network (e.g., LAN or WAN)). The above-mentioned various communication modules 790 may be implemented into one chip or into separate chips, respectively.

According to an embodiment, the wireless communication module 792 may identify and authenticate the electronic device 701 using user information stored in the subscriber identification module 796 in the communication network.

The antenna module 797 may include one or more antennas to transmit or receive the signal or power to or from an external source. According to an embodiment, the communication module 790 (e.g., the wireless communication module 792) may transmit or receive the signal to or from the external electronic device through the antenna suitable for the communication method.

Some components among the components may be connected to each other through a communication method (e.g., a bus, a GPIO (general purpose input/output), an SPI (serial peripheral interface), or an MIPI (mobile industry processor interface)) used between peripheral devices to exchange signals (e.g., a command or data) with each other.

According to an embodiment, the command or data may be transmitted or received between the electronic device 701 and the external electronic device 704 through the server 708 connected to the second network 799. Each of the electronic devices 702 and 704 may be the same or different types as or from the electronic device 701. According to an embodiment, all or some of the operations performed by the electronic device 701 may be performed by another electronic device or a plurality of external electronic devices. When the electronic device 701 performs some functions or services automatically or by request, the electronic device 701 may request the external electronic device to perform at least some of the functions related to the functions or services, in addition to or instead of performing the functions or services by itself. The external electronic device receiving the request may carry out the requested function or the additional function and transmit the result to the electronic device 701. The electronic device 701 may provide the requested functions or services based on the received result as is or after additionally processing the received result. To this end, for example, a cloud computing, distributed computing, or client-server computing technology may be used.

An electronic device according to an embodiment of the disclosure may include a first connector electrically connectable to an external electronic device, a second connector electrically connectable to an external audio plug, a wireless communication circuit, and at least one processor.

According to an embodiment, when the electronic device is connected to the external electronic device through the first connector, the at least one processor may receive a first digital audio signal from the external electronic device through the first connector, may convert the received first digital audio signal into a first analog audio signal, and may output the converted first analog audio signal through the second connector.

According to an embodiment, when the electronic device is connected to the external electronic device through the wireless communication circuit, the at least one processor may receive a second digital audio signal from the external electronic device through the wireless communication circuit, may convert the received second digital audio signal into a second analog audio signal having a sound quality lower than that of the first analog audio signal, and may output the converted second analog audio signal through the second connector.

According to an embodiment, the electronic device may further include a plurality of DACs (digital-to-analog converters), and the at least one processor may convert the first digital audio signal into the first analog audio signal by using the plurality of DACs, and may convert the second digital audio signal into the second analog audio signal by using some of the plurality of DACs.

According to an embodiment, the at least one processor may convert the first digital audio signal into the first analog audio signal in a high power mode, and may convert the second digital audio signal into the second analog audio signal in a low power mode.

According to an embodiment, in a state in which the electronic device is connected to the external electronic device through the first connector, when the connection with the external electronic device connected through the first connector is released, the at least one processor may connect the electronic device with the external electronic device through the wireless communication circuit.

According to an embodiment, in a state in which the electronic device is connected to the external electronic device through the wireless communication circuit, when the electronic device is connected with the external electronic device through the first connector, the at least one processor may release the connection with the external electronic device connected through the wireless communication circuit.

According to an embodiment, the electronic device may further include a battery, and when the electronic device is connected with the external electronic device through the first connector, the at least one processor may charge the battery by using power received from the external electronic device through the first connector.

According to an embodiment, when the connection between the electronic device and the external electronic device that are connected through the first connector is released, the at least one processor may not charge the battery.

According to an embodiment, when a voltage of the battery is less than a specified reference value, the at least one processor may charge the battery by using the power received from the external electronic device through the first connector, and when the voltage of the battery is greater than or equal to the specified reference value, the at least one processor may not charge the battery.

According to an embodiment, when the electronic device is connected to the external audio plug through the second connector, the at least one processor may turn on a pairing mode for establishing a wireless connection with the external electronic device through the wireless communication circuit.

According to an embodiment, the first connector may include a USB-C type connector.

A method of outputting an audio signal by electronic device according to an embodiment of the disclosure may include, when the electronic device is connected to an external electronic device through a first connector of the electronic device, receiving a first digital audio signal from the external electronic device through the first connector, converting the received first digital audio signal into a first analog audio signal, and outputting the converted first analog audio signal through a second connector of the electronic device, when the electronic device is connected to the external electronic device through a wireless communication, receiving a second digital audio signal from the external electronic device through the wireless communication, converting the received second digital audio signal into a second analog audio signal having a sound quality lower than that of the first analog audio signal, and outputting the converted second analog audio signal through the second connector.

According to an embodiment, the converting of the received first digital audio signal into the first analog audio signal may include converting the first digital audio signal into the first analog audio signal by using a plurality of DACs (digital-to-analog converters) of the electronic device, and the converting of the received second digital audio signal into the second analog audio signal may include converting the second digital audio signal into the second analog audio signal by using some of the plurality of DACs.

According to an embodiment, the electronic device may further include, when the electronic device is connected to an external audio plug through the second connector, turning on a pairing mode for establishing a wireless connection with the external electronic device.

According to an embodiment, the electronic device may further include, in a state in which the electronic device is connected to the external electronic device through the first connector, when the connection with the external electronic device connected through the first connector is released, connecting the electronic device with the external electronic device through the wireless communication.

According to an embodiment, the electronic device may further include, in a state in which the electronic device is connected to the external electronic device through the wireless communication, when the electronic device is connected with the external electronic device through the first connector, releasing a wireless connection with the external electronic device.

In addition, a system including an external electronic device, an electronic device connected to the external electronic device, and an audio output device connected to the electronic device, according to an embodiment of the disclosure includes, when the external electronic device and the electronic device are connected through a wired communication, that the external electronic device transmits a first digital audio signal to the electronic device through the wired communication, the electronic device converts the first digital audio signal into a first analog audio signal, and the electronic device outputs the converted first analog audio signal to the audio output device, and when the external electronic device and the electronic device are connected through a wireless communication, that the external electronic device transmits a second digital audio signal to the electronic device through the wireless communication, the electronic device converts the second digital audio signal into a second analog audio signal having a sound quality lower than that of the first analog audio signal, and the electronic device outputs the converted second analog audio signal to the audio output device.

According to an embodiment, the electronic device may include a plurality of DACs (digital-to-analog converters), and the electronic device may convert the first digital audio signal into the first analog audio signal by using the plurality of DACs, and may convert the second digital audio signal into the second analog audio signal by using some of the plurality of DACs.

According to an embodiment, when the electronic device is connected to an external audio plug of the audio output device, the electronic device may turn on a pairing mode for establishing a wireless connection with the external electronic device.

According to an embodiment, in a state in which the electronic device is connected to the external electronic device through the wired communication, when the connection with the external electronic device connected through the wired communication is released, the electronic device may connect to the external electronic device through the wireless communication.

According to an embodiment, in a state in which the electronic device is connected to the external electronic device through the wireless communication, when the electronic device is connected to the external electronic device through the wired communication, the electronic device may release the connection with the external electronic device connected through the wireless communication The electronic device according to various embodiments disclosed in the present disclosure may be various types of devices. The electronic device may include, for example, at least one of a portable communication device (e.g., a smartphone), a computer device, a portable multimedia device, a mobile medical appliance, a camera, a wearable device, or a home appliance. The electronic device according to an embodiment of the present disclosure should not be limited to the above-mentioned devices.

It should be understood that various embodiments of the present disclosure and terms used in the embodiments do not intend to limit technologies disclosed in the present disclosure to the particular forms disclosed herein; rather, the present disclosure should be construed to cover various modifications, equivalents, and/or alternatives of embodiments of the present disclosure. With regard to description of drawings, similar components may be assigned with similar reference numerals. As used herein, singular forms may include plural forms as well unless the context clearly indicates otherwise. In the present disclosure disclosed herein, the expressions "A or B", "at least one of A or/and B", "A, B, or C" or "one or more of A, B, or/and C", and the like used herein may include any and all combinations of one or more of the associated listed items. The expressions "a first", "a second", "the first", or "the second", used in herein, may refer to various components regardless of the order and/or the importance, but do not limit the corresponding components. The above expressions are used merely for the purpose of distinguishing a component from the other components. It should be understood that when a component (e.g., a first component) is referred to as being (operatively or communicatively) "connected," or "coupled," to another component (e.g., a second component), it may be directly connected or coupled directly to the other component or any other component (e.g., a third component) may be interposed between them.

The term "module" used herein may represent, for example, a unit including one or more combinations of hardware, software and firmware. The term "module" may be interchangeably used with the terms "logic", "logical block", "part" and "circuit". The "module" may be a minimum unit of an integrated part or may be a part thereof. The "module" may be a minimum unit for performing one or more functions or a part thereof. For example, the "module" may include an application-specific integrated circuit (ASIC).

Various embodiments of the present disclosure may be implemented by software (e.g., the program 740) including an instruction stored in a machine-readable storage media (e.g., an internal memory 736 or an external memory 738) readable by a machine (e.g., a computer). The machine may be a device that calls the instruction from the machine-readable storage media and operates depending on the called instruction and may include the electronic device (e.g., the electronic device 701). When the instruction is executed by the processor (e.g., the processor 720), the processor may perform a function corresponding to the instruction directly or using other components under the control of the processor. The instruction may include a code generated or executed by a compiler or an interpreter. The machine-readable storage media may be provided in the form of non-transitory storage media. Here, the term "non-transitory", as used herein, is a limitation of the medium itself (i.e., tangible, not a signal) as opposed to a limitation on data storage persistency.

According to an embodiment, the method according to various embodiments disclosed in the present disclosure may be provided as a part of a computer program product. The computer program product may be traded between a seller and a buyer as a product. The computer program product may be distributed in the form of machine-readable storage medium (e.g., a compact disc read only memory (CD-ROM)) or may be distributed only through an application store (e.g., a Play Store™). In the case of online distribution, at least a portion of the computer program product may be temporarily stored or generated in a storage medium such as a memory of a manufacturer's server, an application store's server, or a relay server.

Each component (e.g., the module or the program) according to various embodiments may include at least one of the above components, and a portion of the above sub-components may be omitted, or additional other sub-components may be further included. Alternatively or additionally, some components (e.g., the module or the program) may be integrated in one component and may perform the same or similar functions performed by each corresponding components prior to the integration. Operations performed by a module, a programming, or other components according to various embodiments of the present disclosure may be executed sequentially, in parallel, repeatedly, or in a heuristic method. Also, at least some operations may be executed in different sequences, omitted, or other operations may be added.

The invention claimed is:

1. An electronic device comprising:
a first connector electrically connectable to an external electronic device;
a second connector electrically connectable to an external audio plug;
a wireless communication circuit;
a plurality of DACs (digital-to-analog converters);
a battery; and
at least one processor,
wherein the at least one processor is configured to:
when the electronic device is connected to the external electronic device through the first connector, receive a first digital audio signal from the external electronic device through the first connector, convert the received first digital audio signal into a first analog audio signal in a high power mode, by using all of the plurality of DACs, and output the converted first analog audio signal through the second connector;
when the electronic device is connected to the external electronic device through the wireless communication circuit, receive a second digital audio signal from the external electronic device through the wireless communication circuit, convert the received second digital audio signal into a second analog audio signal having a sound quality lower than that of the first analog audio signal in a low power mode, by using some of the plurality of DACs, and output the converted second analog audio signal through the second connector;
in a state in which the electronic device is connected to the external electronic device through the first connector, when the connection with the external electronic device connected through the first connector is released, connect the electronic device with the external electronic device through the wireless communication circuit;
in a state in which the electronic device is connected to the external electronic device through the wireless communication circuit, when the electronic device is connected with the external electronic device through the first connector, release the connection with the external electronic device connected through the wireless communication circuit;
when a voltage of the battery is less than a specified reference value, charge the battery by using power received from the external electronic device through the first connector; and
when the voltage of the battery is greater than or equal to the specified reference value, not charge the battery.

2. The electronic device of claim 1, wherein, when the connection between the electronic device and the external electronic device that are connected through the first connector is released, the at least one processor is configured not to charge the battery.

3. The electronic device of claim 1, wherein the at least one processor is configured to:
when the electronic device is connected to the external audio plug through the second connector, turn on a pairing mode for establishing a wireless connection with the external electronic device through the wireless communication circuit.

4. The electronic device of claim 1, wherein the first connector includes a USB-C type connector.

5. A method of outputting an audio signal by an electronic device, the method comprising:
when the electronic device is connected to an external electronic device through a first connector of the electronic device,
receiving a first digital audio signal from the external electronic device through the first connector;
converting the received first digital audio signal into a first analog audio signal in a high power mode, by using all of a plurality of DACs; and
outputting the converted first analog audio signal through a second connector of the electronic device,
when the electronic device is connected to the external electronic device through a wireless communication,
receiving a second digital audio signal from the external electronic device through the wireless communication;
converting the received second digital audio signal into a second analog audio signal having a sound quality lower than that of the first analog audio signal in a low power mode, by using some of the plurality of DACs;
outputting the converted second analog audio signal through the second connector;
in a state in which the electronic device is connected to the external electronic device through the first connector, when the connection with the external electronic device connected through the first connector is released, connecting the electronic device with the external electronic device through a wireless communication circuit;
in a state in which the electronic device is connected to the external electronic device through the wireless communication circuit, when the electronic device is connected with the external electronic device through the first connector, releasing the connection with the external electronic device connected through the wireless communication circuit,
when a voltage of a battery of the electronic device is less than a specified reference value, charging the battery by using power received from the external electronic device through the first connector, and
when the voltage of the battery is greater than or equal to the specified reference value, not charging the battery.

6. The method of claim 5, further comprising:
when the electronic device is connected to an external audio plug through the second connector, turning on a pairing mode for establishing a wireless connection with the external electronic device.

* * * * *